United States Patent
Matsuda

(10) Patent No.: US 9,157,378 B2
(45) Date of Patent: Oct. 13, 2015

(54) METHOD FOR MANUFACTURING PIEZOELECTRIC ELEMENT AND PIEZOELECTRIC ELEMENT MANUFACTURED USING SAME

(75) Inventor: Shinya Matsuda, Takarazuka (JP)

(73) Assignee: KONICA MINOLTA HOLDINGS, INC., Tokyo (JP)

( * ) Notice: Subject to any disclaimer, the term of this patent is extended or adjusted under 35 U.S.C. 154(b) by 202 days.

(21) Appl. No.: 13/521,955

(22) PCT Filed: Dec. 21, 2010

(86) PCT No.: PCT/JP2010/007389
§ 371 (c)(1),
(2), (4) Date: Jul. 12, 2012

(87) PCT Pub. No.: WO2011/086645
PCT Pub. Date: Jul. 21, 2011

(65) Prior Publication Data
US 2012/0293040 A1    Nov. 22, 2012

(30) Foreign Application Priority Data
Jan. 12, 2010   (JP) .................................... 2010-4277

(51) Int. Cl.
*H01L 41/04*   (2006.01)
*F02D 11/02*   (2006.01)
(Continued)

(52) U.S. Cl.
CPC ............ *F02D 11/02* (2013.01); *H01L 41/0815* (2013.01); *H01L 41/316* (2013.01);
(Continued)

(58) Field of Classification Search
CPC ..... H04R 17/00; H01L 41/0926; G10K 9/122

USPC .......................................... 310/324; 29/25.35
See application file for complete search history.

(56) References Cited

U.S. PATENT DOCUMENTS

2003/0214561 A1*  11/2003  Shimada et al. ................. 347/68
2006/0033404 A1*   2/2006  Fukui et al. .................... 310/311
(Continued)

FOREIGN PATENT DOCUMENTS

EP    1 168 465    1/2002
JP    05-139892    6/1993
(Continued)

OTHER PUBLICATIONS

"High-performance Piezoelectric materials and advanced application technologies", Science & Technology Co., Ltd., p. 29 and p. 133, w/English translation.
(Continued)

*Primary Examiner* — Derek Rosenau
*Assistant Examiner* — Bryan Gordon
(74) *Attorney, Agent, or Firm* — Cozen O'Connor

(57) ABSTRACT

A stress relaxing layer L22 composed of MgO is formed on the upper surface of a substrate layer L1 in order to alleviate stress acting on a piezoelectric layer L3, the stress relaxing layer L22 is removed while leaving behind a region D1 where the piezoelectric layer L3 is to be formed, and the single crystal piezoelectric layer L3 is formed on the upper surface of the stress relaxing layer L22. As a result, the stress relaxing layer L22 in a region D2 where the piezoelectric layer L3 is not to be formed is preliminarily removed, the region D1 where the piezoelectric layer L3 is to be formed is reduced in size, and stress acting on the piezoelectric layer L3 attributable to the difference in lattice constant between the stress relaxing layer L22 and the piezoelectric layer L3 and thermal expansion is alleviated, thereby enabling favorable single crystallization of the piezoelectric layer L3.

5 Claims, 6 Drawing Sheets

(51) Int. Cl.
- *H01L 41/316* (2013.01)
- *H01L 41/319* (2013.01)
- *H01L 41/08* (2006.01)
- *F02D 11/10* (2006.01)
- *H01L 41/09* (2006.01)
- *H01L 41/187* (2006.01)
- *H01L 41/113* (2006.01)

(52) U.S. Cl.
CPC ........ *H01L41/319* (2013.01); *F02D 2011/103* (2013.01); *F02D 2400/06* (2013.01); *H01L 41/0973* (2013.01); *H01L 41/1138* (2013.01); *H01L 41/1876* (2013.01); *Y10T 29/42* (2015.01)

(56) References Cited

U.S. PATENT DOCUMENTS

2006/0046319 A1* 3/2006 Takeda .............. 438/3
2007/0046156 A1  3/2007 Yasui et al.
2009/0058229 A1* 3/2009 Ibata et al. ............ 310/351

FOREIGN PATENT DOCUMENTS

| | | |
|---|---|---|
| JP | 05-235428 | 9/1993 |
| JP | 06-215975 | 8/1994 |
| JP | 10-120494 | 5/1998 |
| JP | 2005-340428 | 12/2005 |
| JP | 2006-86368 | 3/2006 |
| JP | 2006-100814 | 4/2006 |
| JP | 2007-182335 | 7/2007 |
| JP | 2008-218880 | 9/2008 |
| JP | 2009-170696 | 7/2009 |

OTHER PUBLICATIONS

Office Action dated Nov. 26, 2014 issued in the corresponding European Patent Application No. 10 843 004.2.

* cited by examiner

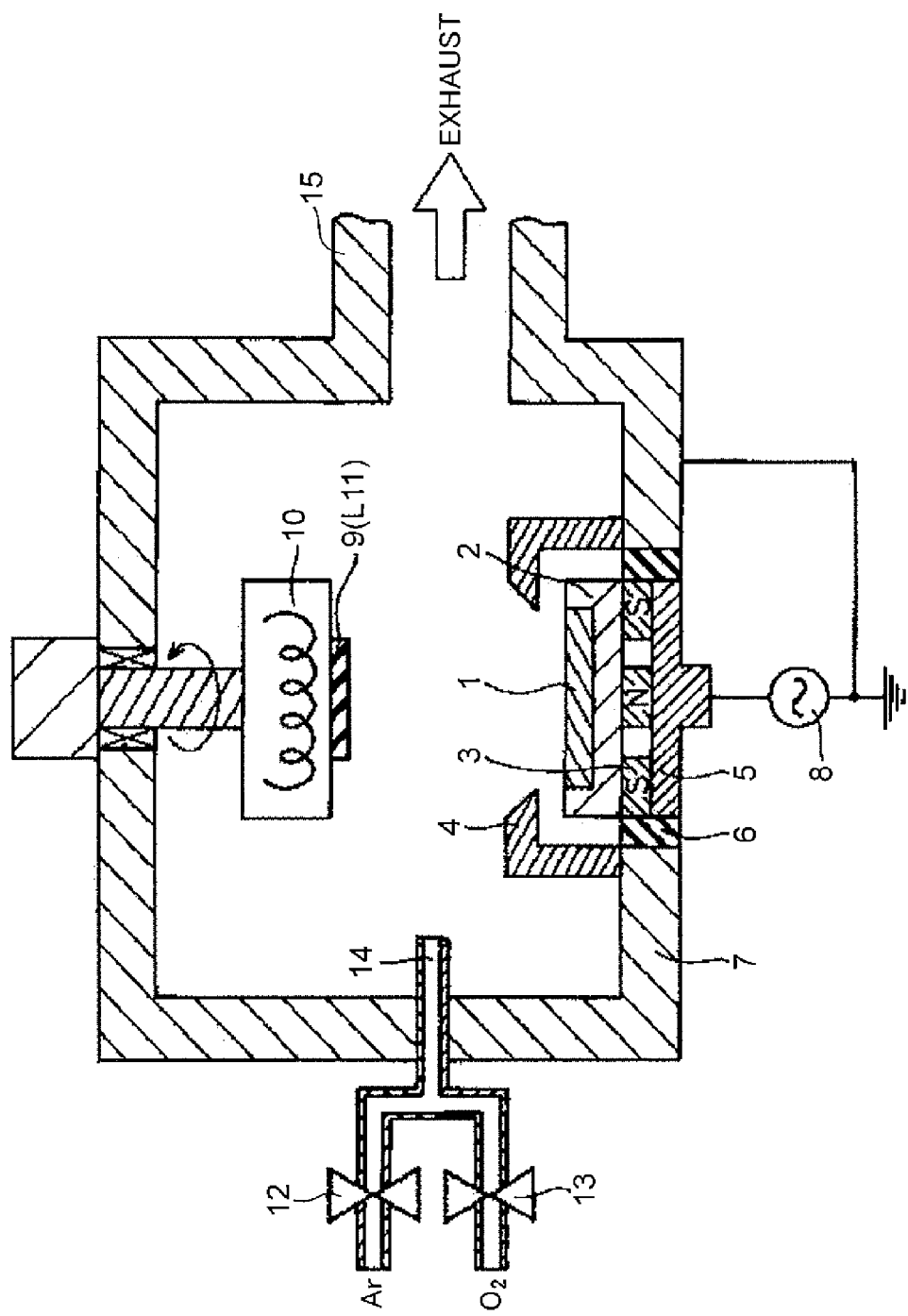

METHOD FOR MANUFACTURING PIEZOELECTRIC ELEMENT AND PIEZOELECTRIC ELEMENT MANUFACTURED USING SAME

RELATED APPLICATIONS

This is a U.S. National Phase Application under 35 USC 371 of International Application PCT/JP2010/007389 filed on Dec. 21, 2010.

This application claims the priority of Japanese Application No. 2010-004277 filed Jan. 12, 2010, the entire content of which is hereby incorporated by reference.

TECHNICAL FIELD

The present invention relates to a piezoelectric element containing a single crystal piezoelectric layer.

BACKGROUND ART

Piezoelectric materials composed of lead zirconate titanate (PZT) and the like have been conventionally used as mechanoelectrical conversion elements such as driver elements and sensors. In addition, in order to respond to demands for reduced device size, higher density and reduced costs, there has recently been an increase in the use of mechanoelectrical conversion elements based on micro electromechanical systems (MEMS) using silicon substrates.

It is preferable to make piezoelectric materials with a form of thin film when composing mechanoelectrical conversion elements with MEMS. As a result, high-precision processing has become possible that uses deposition, photolithography and other semiconductor process technology, thereby making it possible to reduce the size and increase the density of mechanoelectrical conversion elements. In addition, costs can be reduced since configuration of mechanoelectrical conversion elements with MEMS allows a plurality of mechanoelectrical conversion elements to be processed collectively using large area wafers. Moreover, the conversion efficiency of mechanoelectrical conversion elements can be improved, and the characteristics of driver elements as well as sensor sensitivity can also be improved.

Known examples of methods used to deposit PZT and other piezoelectric materials on a silicon (Si) substrate, for example, include chemical methods such as CVD, physical methods such as sputtering or ion plating, and methods such as sol gel methods involving the growth of piezoelectric materials using a liquid phase.

Piezoelectric materials such as PZT are able to realize favorable piezoelectric effects when the crystal structure thereof adopts a perovskite structure. FIG. 6 is a drawing indicating the crystal structure of PZT having a perovskite structure. As shown in FIG. 6, PZT is composed of a mixture of lead titanate and lead zirconate, and can be seen to have a perovskite structure in which titanium (Ti) or zirconium (Zr) is located in the center of a cube, lead (Pb) is positioned at each of the apices, and oxygen is positioned at the center of each side.

In addition, thin films of piezoelectric materials having a perovskite structure allow the obtaining of large piezoelectric characteristics when the thin film adopts a homogeneous single crystal structure.

This tendency is known to be prominent in substances referred to as relaxer materials such as lead magnesium niobate (PMN) or lead zinc niobate (PZN) in which the zirconium (Zr) or titanium (Ti) of PZT is substituted with another element (FIG. 4 on p. 29 of Non-Patent Document 1).

However, since piezoelectric materials such as PZT and Si have different lattice constants, when a piezoelectric material is deposited on an Si substrate, the piezoelectric material adopts a polycrystalline structure in which a plurality of crystals having different orientations are gathered together in the form of columns as shown in FIG. 7 (FIG. 9 on p. 133 of Non-Patent Document 1). FIG. 7 is a cross-sectional view of a piezoelectric material when a piezoelectric material composed of PZT has been formed on the upper surface of a substrate. In the piezoelectric material shown in FIG. 7, although crystal orientation is aligned in a single region, the crystal orientations of adjacent regions differ, and the piezoelectric material has a polycrystalline structure. In the case of a polycrystalline structure, restriction of displacement occurs at the crystal grain boundaries, and piezoelectric characteristics decrease in comparison with a single crystal structure due to the effects thereof. In addition, there is also the problem of being unable to apply a large electric field due to current leakage attributable to the crystal grain boundaries in the case of a polycrystalline structure.

The following technologies are known for solving such problems. Patent Document 1 discloses a technology consisting of providing a relaxing layer composed of MgO and the like between a piezoelectric material and an Si substrate in order to alleviate the mismatch in lattice constants between the two.

In addition, Patent Document 2 discloses a method for single crystallization of a ferroelectric thin film in a method for forming a ferroelectric thin film on a substrate by sputtering, wherein by using a substrate in the shape of a strip, a prominent difference is made to occur in tensile stress or compressive stress between the long sides and short sides of the substrate during cooling after sputtering.

In addition, Patent Document 3 discloses a technology for single crystallization of a piezoelectric material by forming two lower electrodes on a substrate, depositing a piezoelectric material thereon, removing superfluous regions of the two lower electrodes and piezoelectric material so that the two lower electrodes and the piezoelectric material are formed on the substrate in the form of a plurality of columns, and subsequently subjecting to heat treatment.

However, in the technology of Patent Document 1, although a relaxing layer is provided between a piezoelectric material and an Si substrate, due to the large difference in crystal constant between the piezoelectric material and the Si substrate, there is the problem of the piezoelectric material not undergoing single crystallization when the piezoelectric material is formed over a wide range.

In addition, in the technology of Patent Document 2, since a relaxing layer is not provided between a substrate and a ferroelectric thin film resulting in a large mismatch in the lattice constants between the two, there are limits on single crystallization of the ferroelectric thin film.

In addition, in the technology of Patent Document 3, although a piezoelectric material is subjected to single crystallization by heat treatment, since a relaxing layer is not provided for alleviating the difference in lattice constant between the lower electrodes and a piezoelectric material, there are certain limits on single crystallization of the piezoelectric material. In other words, in the case of heat treatment following deposition, since there are limitations on the range of atomic movement, in cases in which there are large variations in the crystal orientation of the piezoelectric material, single crystallization of the piezoelectric material is difficult even if subjected to heat treatment.

Patent Document 1: Japanese Patent Application Laid-open No. H5-139892

Patent Document 2: Japanese Patent Application Laid-open No. H5-235428

Patent Document 3: Japanese Patent Application Laid-open No. H6-215975

Non-Patent Document 1: "High-performance piezoelectric materials and advanced application technologies", Science & Technology Co., Ltd.

SUMMARY OF THE INVENTION

An object of the present invention is to provide a method for manufacturing a piezoelectric element enabling favorable single crystallization of a piezoelectric layer, and a piezoelectric element manufactured according to that manufacturing method.

A method for manufacturing a piezoelectric element according to one aspect of the present invention is provided with a first step of forming an intermediate layer on an upper surface of a substrate layer in order to alleviate stress acting on a piezoelectric layer during deposition of the piezoelectric layer, a second step of removing a portion of the intermediate layer while leaving behind a region where the piezoelectric layer is to be formed, and a third step of forming the piezoelectric layer on an upper surface of the intermediate layer.

In addition, a piezoelectric element according to another aspect of the present invention is provided with a substrate layer, an intermediate layer formed on an upper surface of the substrate layer in order to alleviate stress acting on a piezoelectric layer during deposition of the piezoelectric layer such that a portion of the region thereof is removed except for a region where the piezoelectric layer is to be formed, and a piezoelectric layer formed on an upper surface of the intermediate layer.

BRIEF DESCRIPTION OF THE DRAWINGS

[FIG. 1]

[FIG. 2] FIG. 2 is a cross-sectional view showing an overview of a sputtering device used in the method for manufacturing a piezoelectric element according to an embodiment of the present invention.

FIG. 3 is a flow chart indicating the method for manufacturing a piezoelectric element according to an embodiment of the present invention.

[FIG. 4]

FIG. 5 is a drawing showing a variation of the piezoelectric element according to an embodiment of the present invention.

FIG. 6 is a drawing showing the crystal structure of PZT having a perovskite structure.

FIG. 7 is a cross-sectional view of a piezoelectric material when a piezoelectric material composed of PZT has been formed on a substrate.

MODE FOR CARRYING OUT THE INVENTION

FIGS. 1A to 1E are structural drawings of a piezoelectric element depicting the manufacturing of a piezoelectric element according to an embodiment of the present invention, and the manufacturing process proceeds from A to E in alphabetical order.

Figure 1A:
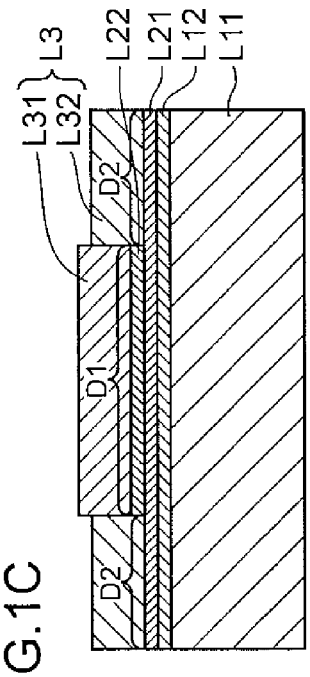
FIGS. 1A to 1E are structural drawings of a piezoelectric element depicting the manufacturing of a piezoelectric element according to an embodiment of the present invention.
Figure 1B:
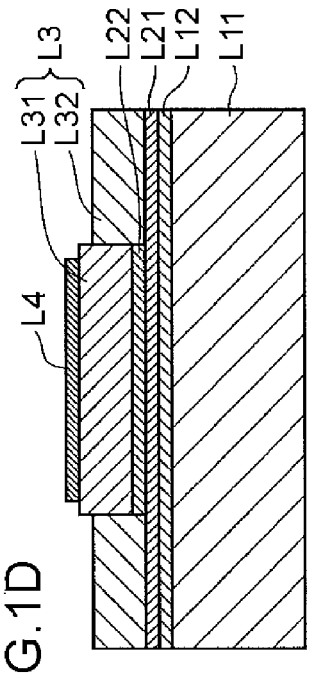
Figure 1C:
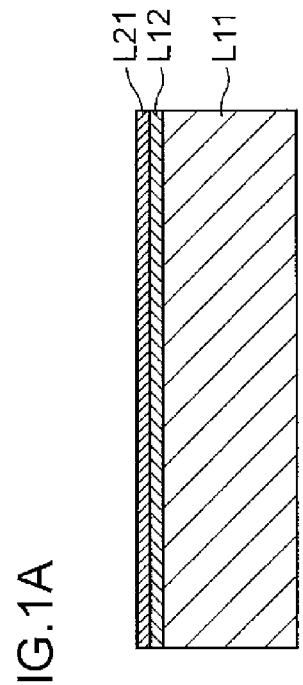
Figure 1D:
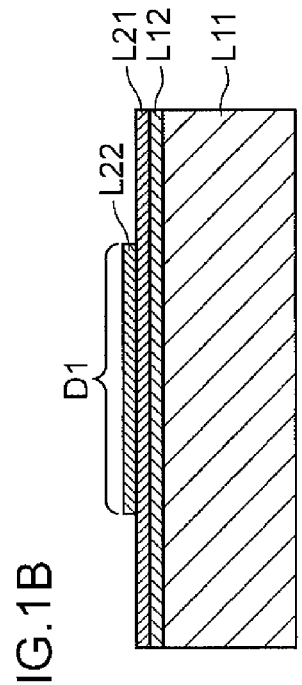
Figure 1E:
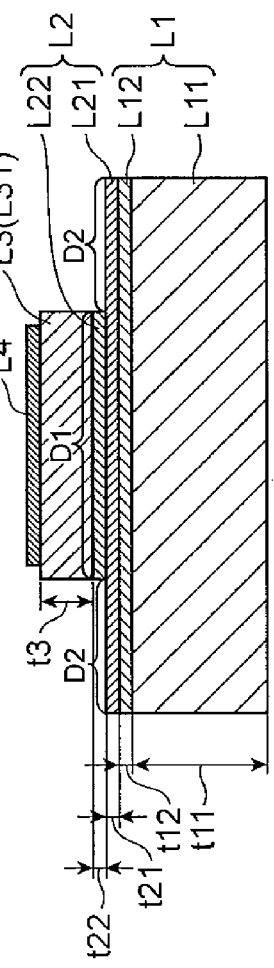

As shown in FIG. 1E, the piezoelectric element is provided with a substrate layer L1, an intermediate layer L2 formed on the upper surface of the substrate layer L1 for alleviating stress acting on a piezoelectric layer L3 during deposition of the piezoelectric layer L3, the piezoelectric layer L3 formed on the upper surface of the intermediate layer L2, and an upper electrode layer L4 formed on the upper surface of the piezoelectric layer L3.

The substrate layer L1 includes a substrate L11 and a thermal oxide film L12 formed on the upper surface of the substrate L11. The substrate L11 is composed of silicon, for example. Although varying according to the device that is to be manufactured, a thickness of, for example, about 300 μm to 500 μm can be employed for the thickness t11 of the substrate L11.

The thermal oxide film L12 is formed on the upper surface of the substrate L11 for the purpose of protecting and insulating the substrate L11, and is composed of $SiO_2$ that is formed by heating the substrate L11 at, for example, about 1500° C. A thickness of, for example, about 0.1 μm can be employed for the thickness t12 of the thermal oxide film L12.

The intermediate layer L2 includes a lower electrode layer L21 formed on the upper surface of the thermal oxide film L12, and a stress relaxing layer L22 formed on the upper surface of the lower electrode layer L21.

The lower electrode layer L21 contains titanium (Ti) formed on the upper surface of the thermal oxide film L12, and platinum (Pt) formed on the upper surface of the titanium. The titanium is provided to improve adhesion between the thermal oxide film L12 and the platinum, and is provided with a film thickness of, for example, about 0.02 μm. In addition, a thickness of, for example, about 0.1 μm is employed for the thickness of the platinum. Thus, a thickness of, for example, about 0.12 μm can be employed for the film thickness t21 of the lower electrode layer L21. Furthermore, the lower electrode layer L21 is formed in the order of titanium and then platinum using a sputtering method, for example.

The stress relaxing layer L22 is composed of, for example, magnesium oxide (MgO), and is formed on the upper surface of the platinum of the lower electrode layer L21. Here, the lattice constant of the stress relaxing layer L22 has a value intermediate between the lattice constant of the lower electrode layer L21 and the piezoelectric layer L3, and is closer to the lattice constant of the piezoelectric layer L3 than the lattice constant of the lower electrode layer L21. Consequently, single crystal growth of the piezoelectric layer L3 can be promoted by the presence of the stress relaxing layer L22. In other words, stress generated in the piezoelectric layer L3 during deposition of the piezoelectric layer L3 attributable to the difference in lattice constant between the platinum composing the lower electrode layer L21 and the piezoelectric layer L3 is alleviated, thereby enabling more favorable single crystallization of the piezoelectric layer L3.

In addition, the stress relaxing layer L22 is formed by, for example, a sputtering method, and the thickness t22 thereof is, for example, about 0.01 μm. In addition, the stress relaxation layer L22 is left behind only in a region D1 where the piezoelectric layer L3 is to be formed and is removed in a region D2 where the piezoelectric layer L3 is not to be formed.

In addition, the piezoelectric layer L3 has a columnar shape. As a result, stress acts symmetrically on the piezoelectric layer L3 during deposition, enabling more favorable single crystallization of the piezoelectric layer L3. In addition, although varying according to the application, a value of for example, about 1 μm or less is employed for the film thickness t3 of the piezoelectric layer L3 in a memory or sensor, while a value of about 5 μm or less is employed in an actuator.

In addition, the stress relaxing layer L22 is only present in the region D1 where the piezoelectric layer L3 is to be formed, while the stress relaxing layer L22 is not present in the region D2 where the piezoelectric layer L3 is not to be formed. Consequently, the size of the region where the piezoelectric layer L3 is to be formed is reduced, and stress acting on the piezoelectric layer L3 attributable to the difference in lattice constant between the stress relaxing layer L22 and the piezoelectric layer L3 and thermal expansion is alleviated, thereby enabling favorable single crystallization of the piezoelectric layer L3.

Due to the small difference in lattice constant between the stress relaxing layer L22 and the piezoelectric layer L3, the piezoelectric layer L3 grows in the form of single crystals in the region D1 as shown in FIG. 1C. On the other hand, since the difference in lattice constant between the platinum of the lower electrode layer L21 and the piezoelectric layer L3 is larger than the difference in lattice constant between the stress relaxing layer L22 and the piezoelectric layer L3, there is a high possibility of the piezoelectric layer L3 growing in the form of polycrystals in the region D2 as shown in FIG. 1C.

The upper electrode layer L4 contains titanium formed in the lower layer and platinum formed in the upper layer. Values roughly equal to the thicknesses of the titanium and platinum that compose the upper electrode layer L4 may be employed for the film thicknesses of the titanium and platinum that compose the lower electrode layer L21.

The following provides a brief explanation of a method for manufacturing a piezoelectric element with reference to FIGS. 1A to 1E. Namely, in FIG. 1A, the thermal oxide film L12 and the lower electrode layer L21 on the substrate L11 are respectively formed in that order over the entire upper surface of the substrate L11.

In FIG. 1B, the stress relaxing layer L22 is formed in the region D1 that is a portion of the lower electrode layer L21 where the piezoelectric layer L3 is to be formed.

In FIG. 1C, the piezoelectric layer L3 is formed on the upper surface of the lower electrode layer L21 and the upper surface of the stress relaxing layer L22, or in other words, over the entire upper surface of the substrate L11. A piezoelectric layer L31 formed in the region D1 is in the form of single crystals, while a piezoelectric layer L32 formed in the region D2 is in the form of polycrystals.

In FIG. 1D, the upper electrode layer L4, which is composed of titanium in the lower layer and platinum in the upper layer, is formed on the upper surface of the piezoelectric layer L3.

In FIG. 1E, the piezoelectric layer L32 is removed and only the piezoelectric layer L31 is left behind, thereby completing the piezoelectric element.

Next, a detailed explanation is provided of a method for manufacturing a piezoelectric element according to the present embodiment. FIG. 2 is a cross-sectional view showing an overview of a sputtering device used in the method for manufacturing a piezoelectric element according to an embodiment of the present invention.

This sputtering device is a device for depositing a thin film of a piezoelectric material and the like by radio frequency magnetron sputtering, and is provided with a target 1, a target holder 2, a magnet 3, a cover 4, a high-frequency electrode 5, an insulator 6, a vacuum chamber 7, a high-frequency power source 8, a substrate 9 (L11), a substrate heater 10, valves 12 and 13, and a nozzle 14 that supplies sputter gas into the vacuum chamber 7.

The vacuum chamber 7 is composed in the shape of a box having a rectangular cross-section, and the high-frequency electrode 5 and the magnet 3 are embedded in the center of the bottom wall thereof. The upper surface of the magnet 3 is continuous with the upper surface of the bottom wall of the vacuum chamber 7. In addition, the high-frequency electrode 5 is arranged beneath the magnet 3. The target holder 2 is placed on the bottom wall of the vacuum chamber 7 above the magnet 3.

The target holder 2 is filled with the target 1 and is placed over the magnet 3. The cover 4 is arranged upright on the bottom wall of the vacuum chamber 7 so that the upper side thereof is open while surrounding the target holder 2 to cause atoms on the surface of the target 1 to fly towards the substrate 9. In addition, the high-frequency electrode 5 is connected to the high-frequency power source 8, and as a result of high-frequency electrical power being applied thereto, microwaves are generated within the vacuum chamber 7. One end of the high-frequency power source 8 is connected to the high-frequency electrode 5, while the other end is grounded.

The bifurcated nozzle 14 is provided in one of the sidewalls of the vacuum chamber 7. Argon (Ar) is supplied to one branch of the nozzle 14, oxygen ($O_2$) is supplied to the other branch, and sputter gas composed of argon and oxygen is supplied into the vacuum chamber 7. The sputter gas supplied into the vacuum chamber 7 is plasmatized by microwaves generated in the vacuum chamber 7. In addition, the valves 12 and 13 are respectively attached to the branches of the nozzle 14 to adjust the flow rates of the Ar and $O_2$.

An exhaust port 15 is provided in the other sidewall of the vacuum chamber 7. A valve and pump (not shown), for example, for evacuating gas inside the vacuum chamber 7 are connected to this exhaust port 15.

A rod-shaped support member is provided in the top wall of the vacuum chamber 7 facing towards the target 1. The substrate heater 10 is suspended from the top wall of the vacuum chamber 7 by this support member so as to oppose the target 1. Here, the substrate heater 10 is covered by, for example, a case having a rectangular shape and composed of an electrically conductive material. The substrate 9 is installed in the vacuum chamber 7 so as to contact the lower surface of the case of the substrate heater 10, and is heated by the substrate heater 10. The magnet 3 and the high-frequency electrode 5 are insulated from the vacuum chamber 7 by the insulator 6.

Furthermore, the substrate heater 10, the high-frequency power source 8 and the valves 12 and 13 are connected to a control device (not shown). In addition, a temperature sensor for measuring the temperature inside the vacuum chamber 7 and a pressure sensor for measuring the pressure inside the vacuum chamber 7 are provided in the vacuum chamber 7.

The control device regulates the temperature inside the vacuum chamber 7 by adjusting the amount of heat generated by the substrate heater 10 based on measurement data obtained from the temperature sensor. In addition, the control device adjusts the pressure within the vacuum chamber 7 by controlling the openings of the valves 12 and 13 along with the opening of a valve and the operation of a pump not shown provided on the side of the exhaust port 15.

In addition, the control device switches the high-frequency power supply 8 on and off to initiate or interrupt the generation of microwaves in the vacuum chamber 7.

In the sputtering device shown in FIG. 2, a powder of a PZT material formulated to a prescribed component ratio is mixed, fired and crushed, filled into the target holder 2, and then pressurized with a press to produce the target 1. The target holder 2 on which the target 1 is placed is installed on the magnet 3, and the cover 4 is installed so as to surround the target holder 2. The substrate 9 is then installed on the lower surface of the case of the substrate heater 10. Air is then evacuated from inside the vacuum chamber 7, and the substrate 9 is heated to, for example, 600° C. by the substrate heater 10.

After heating the substrate 9, the valves 12 and 13 are opened, sputter gas consisting of Ar and $O_2$ is introduced into the vacuum chamber 7 through the nozzle 14 at a prescribed ratio, and the degree of vacuum is maintained at a prescribed value. The high-frequency power source 8 is then activated, microwaves are generated from the high-frequency electrode 5 to plasmatize the sputter gas, and the piezoelectric layer L3 composed of PZT is deposited on the substrate 9.

Figure 3:
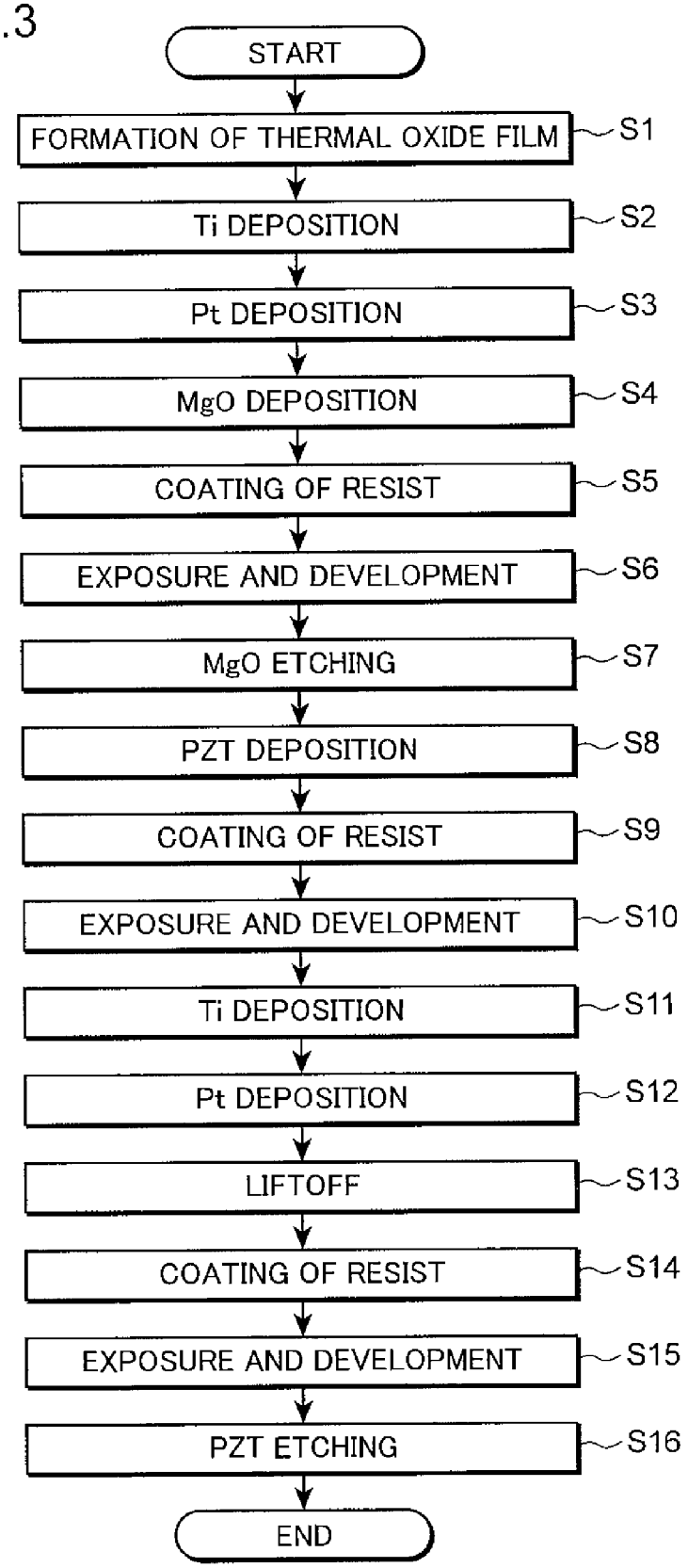
[FIG. 3]

FIG. 3 is a flow chart showing the method for manufacturing a piezoelectric element according to an embodiment of the present invention. First, the substrate L11 is heated to, for example, about 1500° C., and the thermal oxide film L12 composed of $SiO_2$ is formed on the upper surface of the substrate L11 (Step S1).

Next, the titanium target 1 is produced, the substrate L11 on which the thermal oxide film L12 has been formed is installed in the sputtering device, and titanium is deposited over the entire upper surface of the thermal oxide film L12 by sputtering (Step S2). Next, using platinum for the target 1, platinum is deposited over the entire upper surface of the titanium by sputtering in the same manner as in the case of titanium (Step S3). As a result of the processing of Steps S2 and S3, the lower electrode layer L21 is formed over the entire upper surface of the thermal oxide film L12 as shown in FIG. 1A.

Next, using MgO for the target 1, the stress relaxing layer L22 composed of MgO is deposited over the entire upper surface of the lower electrode layer L21 by sputtering (Step S4).

Next, a resist agent is coated onto the entire upper surface of the stress relaxing layer L22 by spin coating (Step S5). Next, the resist agent is dried, and the resist agent is then exposed and developed through a mask so as to leave behind the resist agent only in the region D1 on the upper surface of the stress relaxing layer L22 (Step S6). As a result, the stress relaxing layer L22 in the region D1 is protected.

Next, the substrate L11 coated with the resist agent is immersed in an etching solution to remove the stress relaxing layer L22 in the region D2 (Step S7). Here, a mixture of, for example, hydrofluoric acid and nitric acid can be used for the etching solution. As a result, the substrate L11 is obtained on which the stress relaxing layer L22 remains only in the region D1 as shown in FIG. 1B.

Next, the target 1 is produced using a powder of a PZT material, an intermediate product from which the stress relaxing layer L22 in the region D2 has been removed is installed in the sputtering device, and the piezoelectric layer L3 is deposited on the upper surface of the lower electrode layer L21 and the stress relaxing layer L22 by sputtering (Step S8).

Next, a resist agent is coated over the entire upper surface of the piezoelectric layer L3 by spin coating (Step S9). Next, the resist agent is exposed and developed through a mask pattern so as to remove the resist agent only in a region somewhat smaller than the entire upper surface of the required piezoelectric layer L31 (Step S10). As a result, the piezoelectric layer L3 is protected by the resist agent at those locations other than the region where the upper electrode layer L4 is formed.

Here, the region where the upper electrode layer L4 is formed is made to be of a size that is somewhat smaller than the region of the piezoelectric layer L31 on the upper surface of the region D1. As a result, electrical continuity between the upper electrode layer L4 and the lower electrode layer L21 can be prevented.

Next, titanium is deposited over the entire upper surface of the piezoelectric layer L3 by vapor deposition (Step S11). Next, platinum is deposited over the entire upper surface of the deposited titanium by vapor deposition (Step S12).

Next, the substrate L11 on which the platinum has been deposited is immersed in an etching solution to separate and lift off the titanium and platinum together with the resist agent (Step S13). As a result, as shown in FIG. 1D, the upper electrode layer L4, composed of titanium in the lower layer and platinum in the upper layer, is formed in a region somewhat smaller than the entire upper surface of the required piezoelectric layer L31. Here, an etching solution specified by the resist agent is used for the etching solution.

Next, a resist agent is coated onto the entire upper surface of the piezoelectric layer L3 on which the upper electrode layer L4 has been formed by spin coating (Step S14). Next, the resist agent is exposed and developed through a mask pattern so as to leave behind the resist agent only on the piezoelectric layer L31 on the upper surface of the region D1 (Step S15). As a result, the piezoelectric layer L31 on the upper surface of the region D1 is protected by the resist agent.

Next, the substrate L11 obtained following Step S15 is immersed in an etching solution to remove the superfluous piezoelectric layer L32 on the upper side of the region D2 (Step S16). Here, an etching solution composed of a mixture of hydrofluoric acid and nitric acid may be used for the etching solution in the same manner as the etching solution used in the case of removing the stress relaxing layer L22. As a result, the piezoelectric element shown in FIG. 1E is obtained.

Furthermore, Steps S1 to S4 in FIG. 3 correspond to an example of a first step of forming an intermediate layer on the upper surface of the substrate layer L1 for alleviating stress acting on the piezoelectric layer L3 during deposition of the piezoelectric layer L3. In addition, Steps S5 to S7 correspond to an example of a second step of removing a portion of the intermediate layer L2 while leaving behind the region D1 where the piezoelectric layer L3 is to be formed. In addition, Steps S8 to S16 correspond to an example of a third step of forming a single crystal piezoelectric layer L3 on the upper surface of the intermediate layer L2.

Figure 4A:
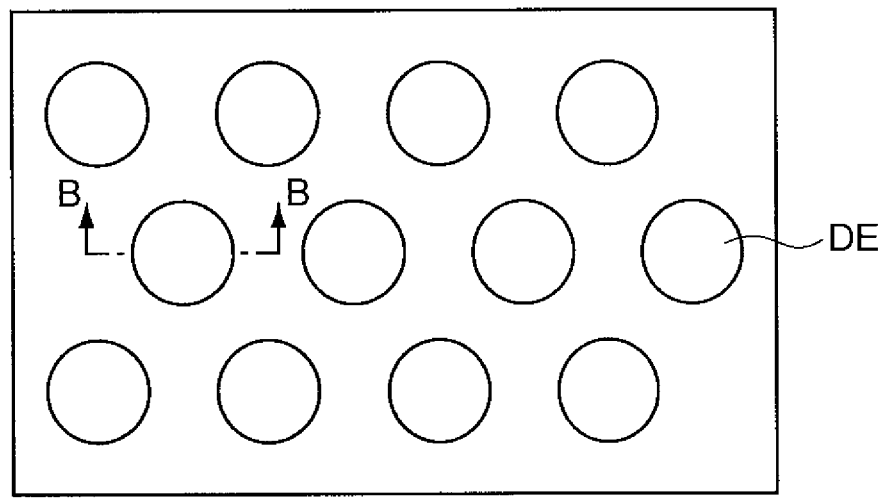
FIGS. 4A and 4B depict a cross-sectional view of a diaphragm in the case of applying the piezoelectric element according to an embodiment of the present invention to a diaphragm.
Figure 4B:
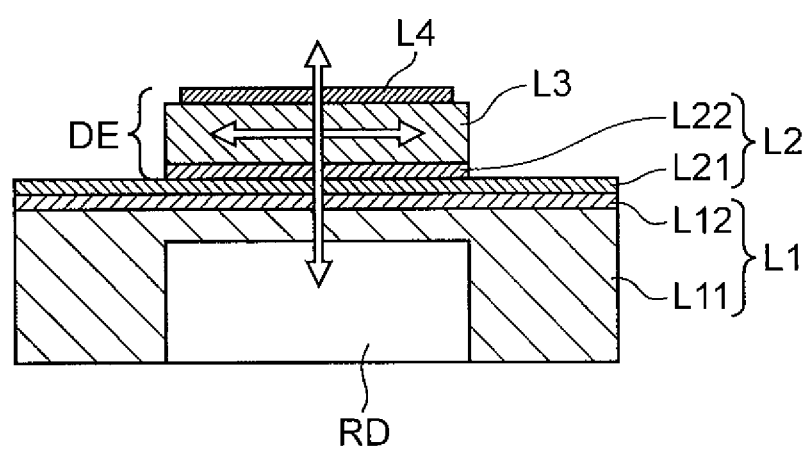

Next, an explanation is provided of the case of applying a piezoelectric element obtained by going through the above-mentioned manufacturing method to a diaphragm. FIGS. 4A and 4B depict a cross-sectional view of a diaphragm in the case of applying a piezoelectric element according to an embodiment of the present invention to a diaphragm. FIG. 4A shows a top view of a diaphragm, while FIG. 4B shows a cross-sectional view taken along line B-B of FIG. 4A.

As shown in FIG. 4A, the diaphragm is provided with a plurality of diaphragm elements DE arranged in a staggered manner in required regions on the upper surface of the lower electrode layer L21. The diaphragm elements DE have a cylindrical shape, and are provided with the stress relaxing layer L22 formed in a lower layer, the piezoelectric layer L3 formed in an intermediate layer, and the upper electrode layer L4 formed in an upper layer and having a size that is somewhat smaller than the size of the upper surface of the piezoelectric layer L3.

As shown in FIG. 4B, in those regions where the diaphragm elements DE are formed, removed areas RD are formed by removing a portion of the substrate L11 in the shape of a cylinder. Here, the cross-sectional size of the removed areas RD is equal to, for example, the cross-sectional size of the diaphragm elements DE.

The upper electrode layer L4 and lower electrode layer L21 that compose each of the diaphragm elements DE are connected to an external control circuit by, for example, wiring not shown. A specified diaphragm element DE can be driven by applying an electrical signal to the specified diaphragm element DE from this control circuit.

When a prescribed electric field is applied to the lower electrode layer L21 and the upper electrode layer L4 of the specified diaphragm element DE, the piezoelectric layer L3 expands and contracts in the lateral directions, and according to the operating principle of bimetals, the substrate L11 of the upper portion of the removed area RD, the thermal oxide film L12, the lower electrode layer L21 and the diaphragm element DE bend in the vertical direction.

Thus, by attaching a plate in which a hole is formed to the lower surface of the removed area RD and filling a gas or liquid into the removed area RD, the diaphragm can be used as a pump. In addition, by filling ink into the removed area RD, this diaphragm can also be used as a printer head of an inkjet printer.

In addition, if the diaphragm is vibrated by sound waves or ultrasonic waves, an electric field is generated between the upper electrode layer L4 and the lower electrode layer L21 by the opposite effect from that described above, and an electric charge is accumulated in both electrode layers. Thus, the amount of deformation of the diaphragm can be detected by detecting the amount of electrical charge accumulated in both electrode layers. The diaphragm can then be used as a sensor by detecting the frequency or amplitude and the like of the diaphragm.

Figure 5:
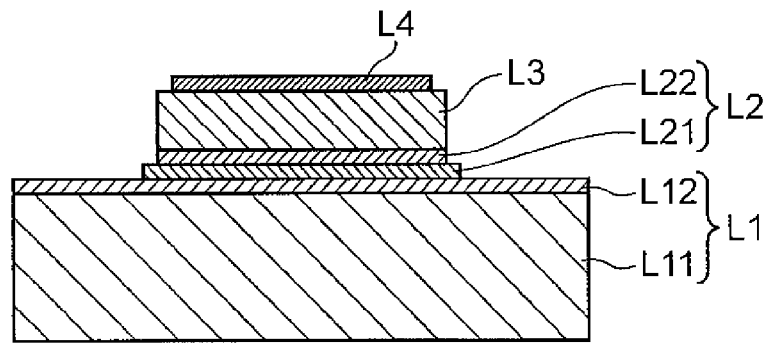
[FIG. 5]
Figure 6:
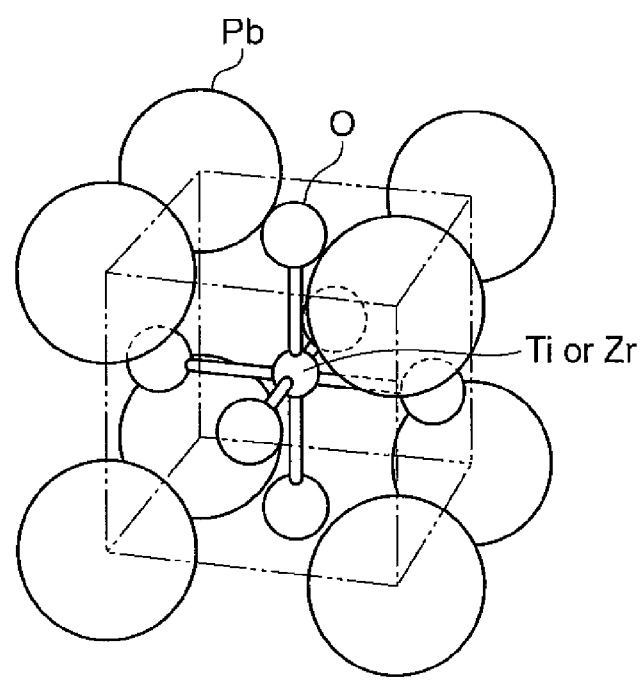
[FIG. 6]
Figure 7:
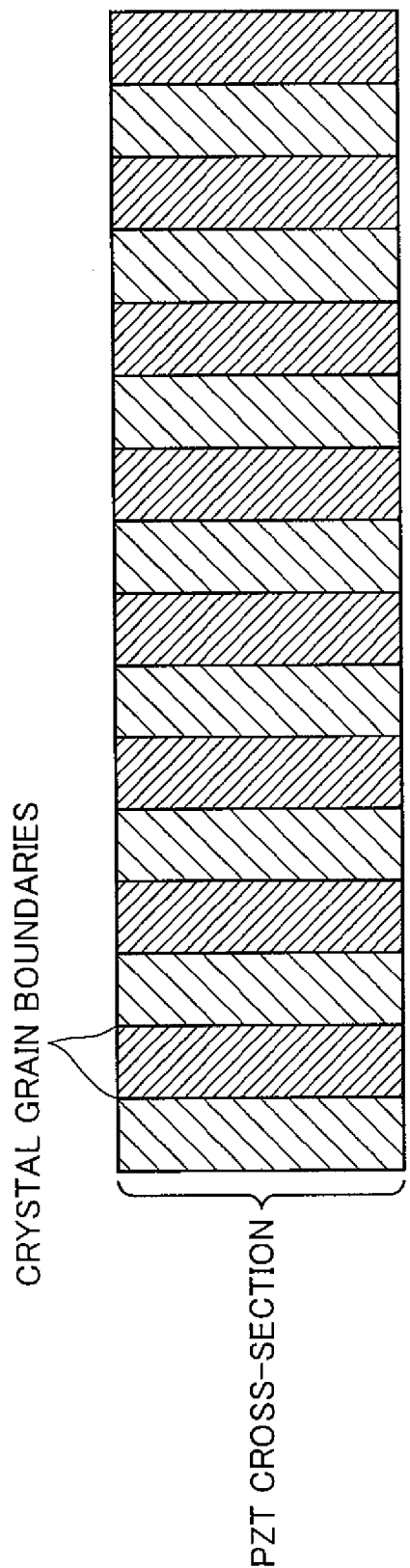
[FIG. 7]

FIG. 5 is a drawing showing a variation of a piezoelectric element according to an embodiment of the present invention. Although the lower electrode layer L21 is formed over the entire upper surface of the thermal oxide film L12 in FIG. 1E, in FIG. 5, the lower electrode layer L21 is formed to a size that is equal to or somewhat larger than the lower surface of the stress relaxing layer L22.

In the case of this type of lower electrode layer L21, after having deposited the lower electrode layer L21 on the entire upper surface of the thermal oxide film L12 by sputtering, the remaining region of the lower electrode layer L21 is protected with a resist agent, followed by removing the superfluous portion of the lower electrode layer L21 by etching.

Furthermore, deposition of the stress relaxing layer L22 composed of MgO is carried out after removing the superfluous region of the lower electrode layer L21. As a result, the surface area of the lower electrode layer L21 becomes smaller, single crystallization can be carried out more favorably on the stress relaxing layer L22 composed of MgO formed on the upper surface of the lower electrode layer L21, and the piezoelectric layer L3 can be allowed to undergo single crystallization more favorably.

In addition, although the intermediate layer L2 is composed of the lower electrode layer L21 and the stress relaxing layer L22 in the piezoelectric element shown in FIG. 1E and FIG. 5, the stress relaxing layer L22 may be omitted. The lattice constant of the lower electrode layer L21 is closer to the lattice constant of the piezoelectric layer L3 than the lattice constant of the thermal oxide film L12. Consequently, in comparison with the case of forming the piezoelectric layer L3 directly on the thermal oxide film L12, forming the piezoelectric layer L3 on the thermal oxide film L12 with the lower electrode layer L21 interposed there between enables more favorable single crystallization of the piezoelectric layer L3.

Furthermore, since the lattice constant of the stress relaxing layer L22 is closer to the lattice constant of the piezoelectric layer L3 than the lattice constant of the lower electrode layer L21, in comparison with the case of forming the piezoelectric layer L3 on the lower electrode layer L21, forming the piezoelectric layer L3 with the stress relaxing layer L22 interposed there between enables more favorable single crystallization of the piezoelectric layer L3.

In addition, although PZT was employed for the piezoelectric layer L3 in the previous explanations, the piezoelectric layer L3 is not limited thereto, but rather a relaxer material such as lead magnesium niobate (PMN) or lead zinc niobate (PZN) may also be employed.

As has been explained above, since the stress relaxing layer L22 in a region where the piezoelectric layer L3 is not to be formed is preliminarily removed and the region where the piezoelectric layer L3 is reduced in size in the above-mentioned piezoelectric element, stress acting on the piezoelectric layer L3 attributable to the difference in lattice constant between the stress relaxing layer L22 and the piezoelectric layer L3 and thermal expansion is alleviated, thereby enabling favorable single crystallization of the piezoelectric layer L3.

The following provides a summary of the technical characteristics of the method for manufacturing a piezoelectric element and the manufactured piezoelectric element as previously described.

(1) The method for manufacturing a piezoelectric element according to one aspect of the present invention is provided with a first step of forming an intermediate layer on the upper surface of a substrate layer in order to alleviate stress acting on a piezoelectric layer during deposition of the piezoelectric layer, a second step of removing a portion of the intermediate layer while leaving behind a region where the piezoelectric layer is to be formed, and a third step of forming the piezoelectric layer on the upper surface of the intermediate layer.

According to this configuration, after having removed a portion of the intermediate layer while leaving behind a region where the piezoelectric layer is to be formed, the piezoelectric layer is formed on the upper surface of the remaining intermediate layer. In other words, since a region of the intermediate layer where the piezoelectric layer is not to be formed is preliminarily removed and the region where the piezoelectric layer is formed is reduced in size, stress acting on the piezoelectric layer attributable to the difference in lattice constant between the intermediate layer and the piezoelectric layer and thermal expansion is alleviated, thereby enabling favorable single crystallization of the piezoelectric layer.

(2) In the above-mentioned second step, a prescribed independent region on the intermediate layer is preferably left behind, while the area surrounding that region is preferably removed.

According to this configuration, the intermediate layer is formed in the form of an island on the upper surface of the substrate, and the piezoelectric layer can be formed in the center of the upper surface of the substrate. Consequently, vibrations of the piezoelectric layer can be uniformly transmitted to the substrate, thereby enabling the manufacturing of a piezoelectric element that is favorable for use as an ink head of an inkjet printer and the like.

(3) The intermediate layer preferably includes an electrode layer and a stress relaxing layer, and in the first step, the electrode layer is preferably formed on the upper surface of the substrate layer and the stress relaxing layer is preferably formed on the upper surface of the electrode layer thus formed.

According to this configuration, a piezoelectric element can be provided in which an electrode layer and stress relaxing layer are laminated on the upper surface of a substrate layer. In addition, since the intermediate layer includes not only an electrode layer but also a stress relaxing layer, stress generated when forming the piezoelectric layer on the upper surface of the stress relaxing layer is alleviated more effectively, thereby enabling more reliable single crystallization of the piezoelectric layer.

(4) In the second step, a portion of the stress relaxing layer formed on the upper surface of the electrode layer is preferably removed, and in the third step, the piezoelectric layer is preferably formed on the upper surface of the electrode layer and on the upper surface of the stress relaxing layer, and the piezoelectric layer formed on the upper surface of the electrode layer is preferably removed.

According to this configuration, only the piezoelectric layer that has undergone favorable single crystallization formed on the upper surface of the stress relaxing layer remains, and since the piezoelectric layer that has not undergone single crystallization formed on the electrode layer is removed, a piezoelectric element can be manufactured having a piezoelectric layer that has undergone favorable single crystallization.

(5) The substrate layer preferably includes a substrate and a thermal oxide film, and in the first step, the intermediate layer is preferably formed on the upper surface of the thermal oxide film.

According to this configuration, since a thermal oxide film is formed between an intermediate layer and a substrate, the intermediate layer and the substrate are insulated and both can be protected.

(6) A piezoelectric element according to another aspect of the present invention is provided with a substrate layer, an intermediate layer formed on an upper surface of the substrate layer in order to alleviate stress acting on a piezoelectric layer during deposition of the piezoelectric layer such that a portion of the region thereof is removed except for a region where the piezoelectric layer is to be formed, and a piezoelectric layer formed on an upper surface of the intermediate layer.

According to this configuration, since an intermediate layer is formed only in a region where a piezoelectric layer is to be formed, the region where the piezoelectric layer is formed is reduced in size, stress generated in the piezoelectric layer when forming the piezoelectric layer is alleviated, and a piezoelectric element can be manufactured having a piezoelectric layer that has undergone favorable single crystallization.

In the above-mentioned piezoelectric element, the substrate layer preferably has an oxide film layer formed on the surface thereof, the intermediate layer preferably includes a lower electrode layer formed on the upper surface of the oxide film layer and a stress relaxing layer formed in a prescribed region on the upper surface of the lower electrode layer, the piezoelectric layer is preferably formed on the upper surface of the stress relaxing layer and an upper electrode layer formed on the upper surface of the piezoelectric layer is further provided, and the lattice constant of the stress relaxing layer preferably has a value that is intermediate between the lattice constant of the lower electrode layer and the lattice constant of the piezoelectric layer.

According to this configuration, a lower electrode layer and a stress relaxing layer are included in the intermediate layer, and the lattice constant of the stress relaxing layer has a value that is intermediate between the lattice constant of the lower electrode layer and the lattice constant of the piezoelectric layer. As a result, the lattice constant of the piezoelectric layer is closer to the lattice constant of the stress relaxing layer than the lattice constant of the lower electrode layer, and in comparison with the case of forming the piezoelectric layer directly on the upper surface of the lower electrode layer, stress generated in the piezoelectric layer during formation of the piezoelectric layer can be alleviated more reliably. As a result, the piezoelectric layer can be made to undergo single crystallization more favorably.

The invention claimed is:

1. A piezoelectric element comprising:
a substrate layer;
an intermediate layer formed on an upper surface of the substrate layer in order to alleviate stress acting on a piezoelectric layer during deposition of the piezoelectric layer such that a portion of the intermediate layer is removed except for a region where the piezoelectric layer is to be formed; and
a piezoelectric layer formed on an upper surface of the intermediate layer,
wherein the substrate layer has an oxide film layer formed on the surface thereof,
wherein the intermediate layer includes a lower electrode layer formed on an upper surface of the oxide film layer and a stress relaxing layer formed in a prescribed region on an upper surface of the lower electrode layer,
wherein the piezoelectric layer is formed on an upper surface of the stress relaxing layer,
wherein the piezoelectric element further includes an upper electrode layer formed on the upper surface of the piezoelectric layer, and
wherein the lattice constant of the stress relaxing layer has a value that is closer to the lattice constant of the piezoelectric layer than the lattice constant of the lower electrode layer.

2. The piezoelectric element of claim 1, wherein the piezoelectric layer includes a single crystal piezoelectric layer.

3. The piezoelectric element of claim 1, wherein the piezoelectric layer is a layer formed after the portion of the intermediate layer is removed.

4. The piezoelectric element of claim 1, wherein the piezoelectric layer includes a single crystal piezoelectric layer.

5. The piezoelectric element of claim 1, wherein the piezoelectric layer is a layer formed after a portion of the intermediate layer is removed.

* * * * *